(12) United States Patent
Sander

(10) Patent No.: US 6,528,975 B2
(45) Date of Patent: Mar. 4, 2003

(54) SATURATION PREVENTION AND AMPLIFIER DISTORTION REDUCTION

(75) Inventor: Wendell B. Sander, Los Gatos, CA (US)

(73) Assignee: Tropian Inc., Cupertino, CA (US)

( * ) Notice: Subject to any disclaimer, the term of this patent is extended or adjusted under 35 U.S.C. 154(b) by 0 days.

(21) Appl. No.: 09/738,691

(22) Filed: Dec. 15, 2000

(65) Prior Publication Data

US 2002/0074980 A1 Jun. 20, 2002

(51) Int. Cl.[7] .............................. G05F 1/40; H04B 1/04
(52) U.S. Cl. .................. 323/281; 323/274; 455/127
(58) Field of Search .................... 323/274, 269, 323/273, 282, 284, 280, 281; 455/115, 108, 119, 127, 126; 330/129, 149

(56) References Cited

U.S. PATENT DOCUMENTS

| | | | | | |
|---|---|---|---|---|---|
| 4,355,303 A | * | 10/1982 | Phillips et al. | ............... | 340/310 |
| 5,079,497 A | * | 1/1992 | Barbu et al. | ................. | 323/281 |
| 5,175,879 A | * | 12/1992 | Ellingson et al. | ........... | 455/126 |
| 5,302,913 A | * | 4/1994 | Hori | ........................... | 330/129 |
| 5,548,205 A | * | 8/1996 | Monnticelli | ................. | 323/274 |
| 5,564,087 A | * | 10/1996 | Cygan et al. | ............... | 455/126 |

* cited by examiner

Primary Examiner—Rajnikant B. Patel

(57) ABSTRACT

The present invention, generally speaking, provides methods and apparatus for avoiding saturation of a transistor, with particular application to communications signal amplifiers. In accordance with one aspect of the invention, feedback circuitry is provided to control a transistor in accordance with a control signal. The combination of current monitor and a threshold comparator detects when the base current of the transistor exceeds a threshold, indicative of the onset of saturation. Feedback control is then modified to prevent saturation.

28 Claims, 4 Drawing Sheets

SATURATION PREVENTION AND AMPLIFIER DISTORTION REDUCTION

BACKGROUND OF THE INVENTION

1. Field of the Invention

The present invention relates to preventing saturation of transistors, with application to amplifier distortion reduction.

2. State of the Art

In the communications field, communications signals are required to be produced with low distortion. Particularly in wireless communications, low distortion is required in order to avoid adjacent channel interference (sometimes referred to as "splatter"). A principle cause of distortion in wireless communications is saturation of a final amplifier stage, resulting in signal clipping.

U.S. Pat. No. 5,021,753 describes a linear amplifier including an arrangement for avoiding saturation of the amplifier. Conventional quadrature modulation is employed. In this arrangement an error signal is derived by comparing a desired signal component (I or Q) to a corresponding measured signal component obtained using a Cartesian feedback circuit. When the error exceeds a threshold, a pulse is generated. The frequency of occurrence of such pulses over time is monitored by a processor. The processor adjusts a scale factor within the circuit such that the frequency with which the error threshold is exceeded remains within a desired range.

The use of Cartesian feedback to control amplifier saturation introduces significant circuit complexity, particularly if the effects of feedback delay are to be compensated for. Moreover, such a technique is not readily applicable to an amplifier following a polar architecture such as that described in High Efficiency Modulating RF Amplifier, U.S. patent application Ser. No. 09/637,269, filed Aug. 10, 2000, incorporated herein by reference.

Accordingly, techniques are needed that avoid Cartesian feedback and that may be used with amplifier architectures other than the conventional quadrature modulator architecture. More generally, improved techniques are needed for avoiding transistor saturation.

SUMMARY OF THE INVENTION

The present invention, generally speaking, provides methods and apparatus for avoiding saturation of a transistor, with particular application to communications signal amplifiers. In accordance with one aspect of the invention, feedback circuitry is provided to control a transistor in accordance with a control signal. The combination of current monitor and a threshold comparator detects when the base current of the transistor exceeds a threshold, indicative of the onset of saturation. Feedback control is then modified to prevent saturation.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
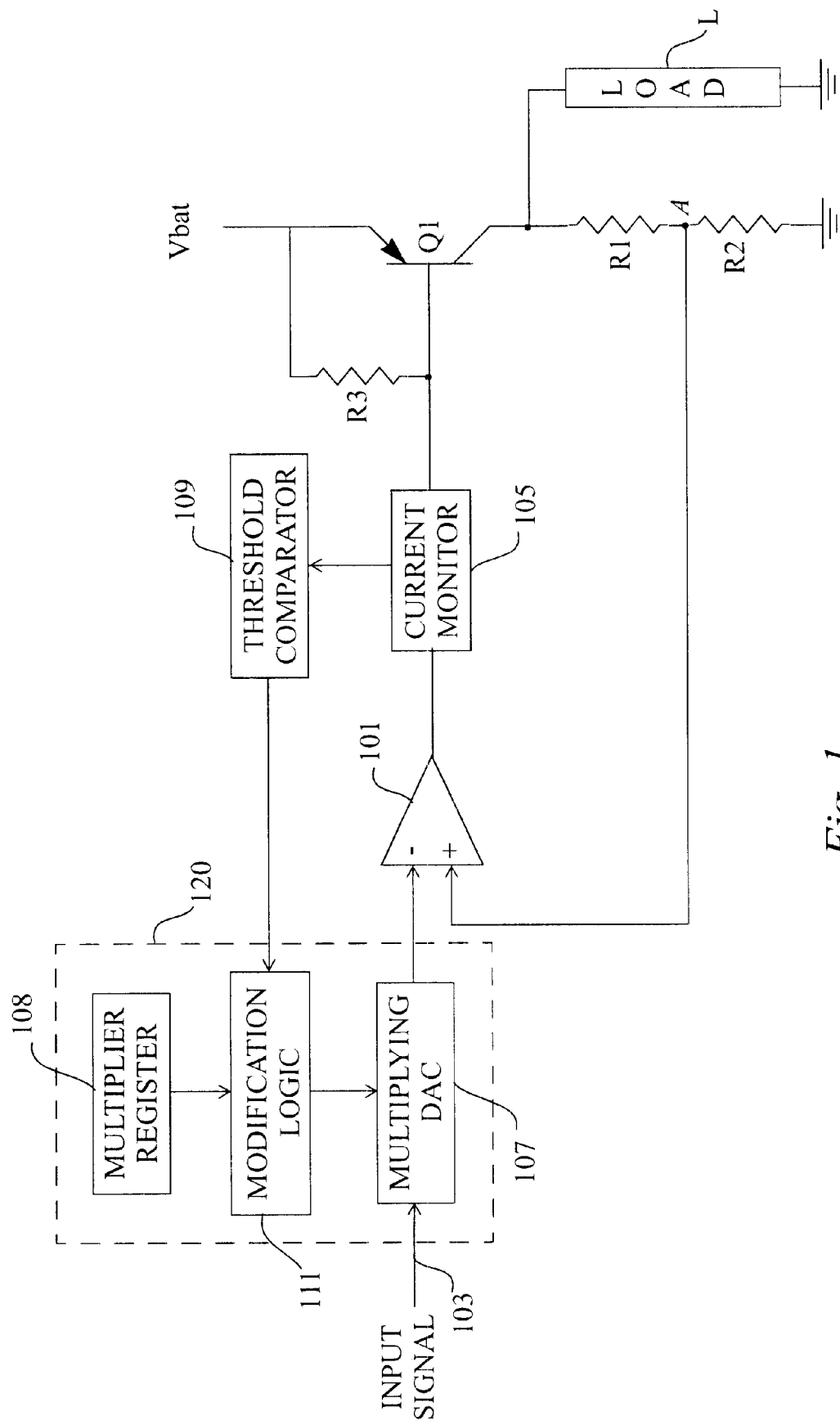
FIG. 1 is a diagram of a saturation prevention circuit in accordance with an exemplary embodiment of the invention.
Figure 3:
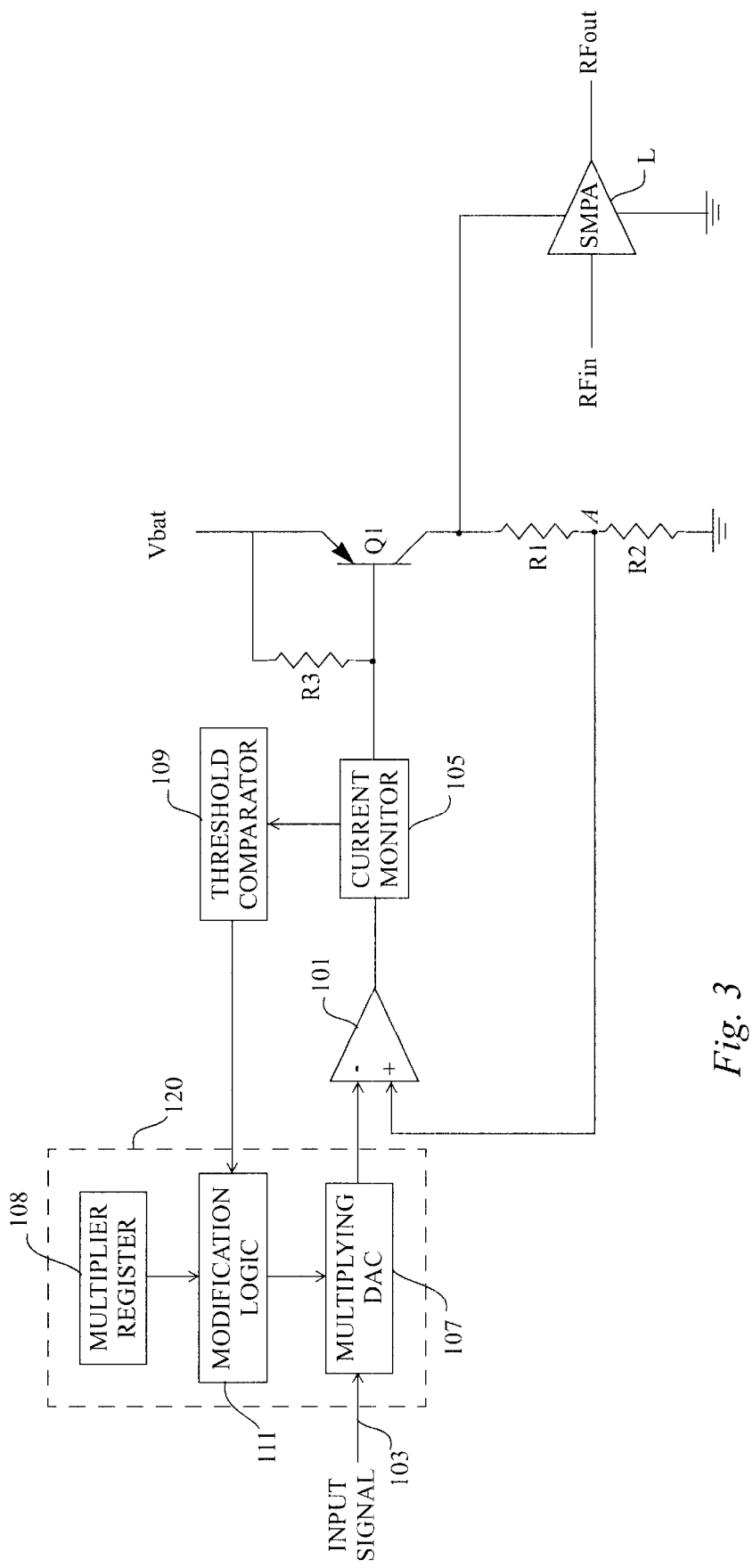
FIG. 3 is a diagram showing one possible application of the circuit of FIG. 1.

Referring now to FIG. 1, a diagram is shown of a saturation prevention circuit in accordance with an exemplary embodiment of the invention. A transistor Q1 is coupled to a power source, Vbat, and to a load L. In one possible application, the load L is a final amplifier stage of an RF amplifier as illustrated in FIG. 3 and described in greater detail in the foregoing co-pending application.

In the configuration illustrated in FIG. 1, the transistor Q1 is a bipolar transistor having an emitter terminal coupled to Vbat and a collector terminal coupled to the load L. The collector terminal is also coupled to a resistive network comprising series-connected resistors R1 and R2 coupled to ground. A voltage occurring at node A between the resistors R1 and R2 is proportional to the voltage applied to the load L. A resistor R3 is coupled between the emitter terminal and the base terminal of the transistor Q1. The combination of the resistors R1—R3 allows the gain of the transistor Q1 to be set.

A differencing operational amplifier (op amp) 101 is provided as part of a feedback circuit used to control the transistor Q1 and thus set a voltage applied to the load L. A positive input terminal of the op amp is connected to node A of the circuit. In concept, the negative input terminal is coupled to a command input signal 103, and an output signal of the op amp 101 is coupled to the base terminal of the transistor Q1. In the illustrated circuit, however, a current monitor 105 is inserted between the output signal of the op amp 101 and the base terminal of the transistor Q1.

Furthermore, since in the illustrated circuit the command input signal is digital and the op amp 101 requires an analog input signal, a digital-to-analog converter (DAC) 107 is inserted in this path. The DAC 107 is a multiplying DAC, allowing a scale factor to be applied to the command input signal. The scale factor to be applied (at least in the absence of saturation) is stored in a multiplier register 108. This value determines the power output to the load.

Saturation prevention is carried out in response to the current monitor 105, by a threshold comparator 109 and modification logic 111. The threshold comparator is coupled to the current monitor 105 and to the modification logic 111. The modification logic is coupled to the threshold comparator 109, the multiplier register 108, and the DAC 107. Together, the modification logic 111, multiplier register 108 and multiplying DAC 107 perform a scaling function represented by block 120.

Operation of the saturation prevention circuit is based on the following principle. In order to achieve a particular voltage at node A of the circuit, the required base current into the transistor Q1 will varying linearly with the desired voltage throughout the linear range of the transistor Q1. However, as the transistor Q1 approaches saturation, the base current will rapidly rise (by action of the feedback arrangement) in an unsuccessful attempt to raise the voltage at node A to the desired level. This rapid rise in base current is detected immediately by the current monitor 105 in combination with the threshold comparator 109. The onset of saturation is thus signaled to the modification logic 111. The modification logic then modifies downward the scale factor stored in the multiplier register such that an appropriately reduced scale factor is applied to the multiplying DAC 107. As a result, the transistor Q is driven less heavily, and saturation is rapidly averted.

The modification logic may vary from simple to complex, and may be implemented in hardware or as code executed by a processor (as in the foregoing U.S. Pat. No. 5,021,753, for example).

Figure 2:
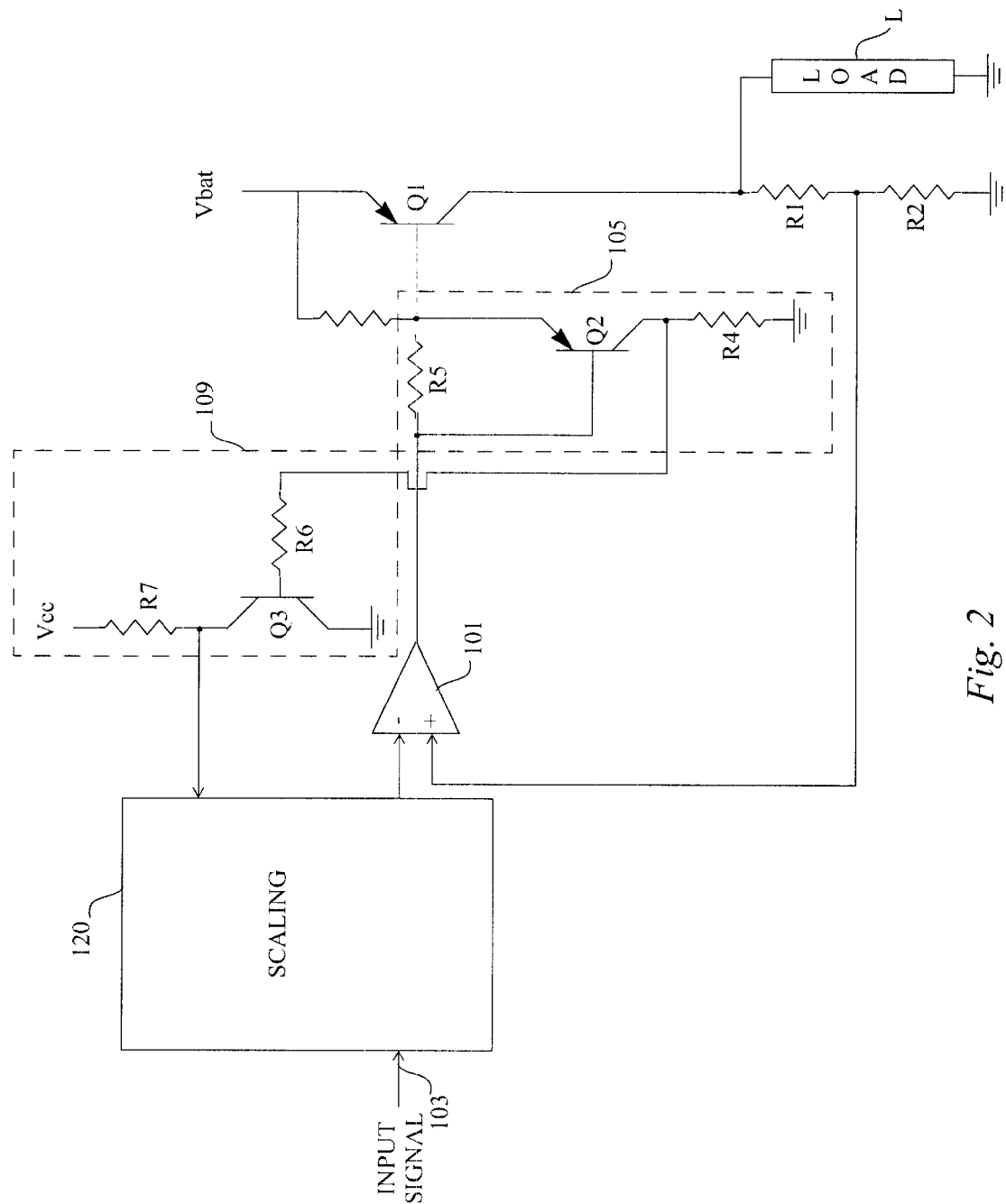
FIG. 2 is a detailed diagram of one implementation of the circuit of FIG. 1.

Referring to FIG. 2, one particular implementation is shown, illustrating further details of the current monitor 107 and the threshold comparator 109. The current monitor may take the form of an emitter-follower stage comprising a transistor Q2 and resistors R4 and R5. The threshold comparator may take the form of a common-emitter stage comprising a transistor Q3 and resistors R6 and R7. In operation, a current flows through the resistor R7 that is proportional to the base current of the transistor Q1. Depending on that magnitude of that current, the output voltage developed at the comparator output will be either below or above a logic threshold of the scaling circuit 120.

Figure 4:
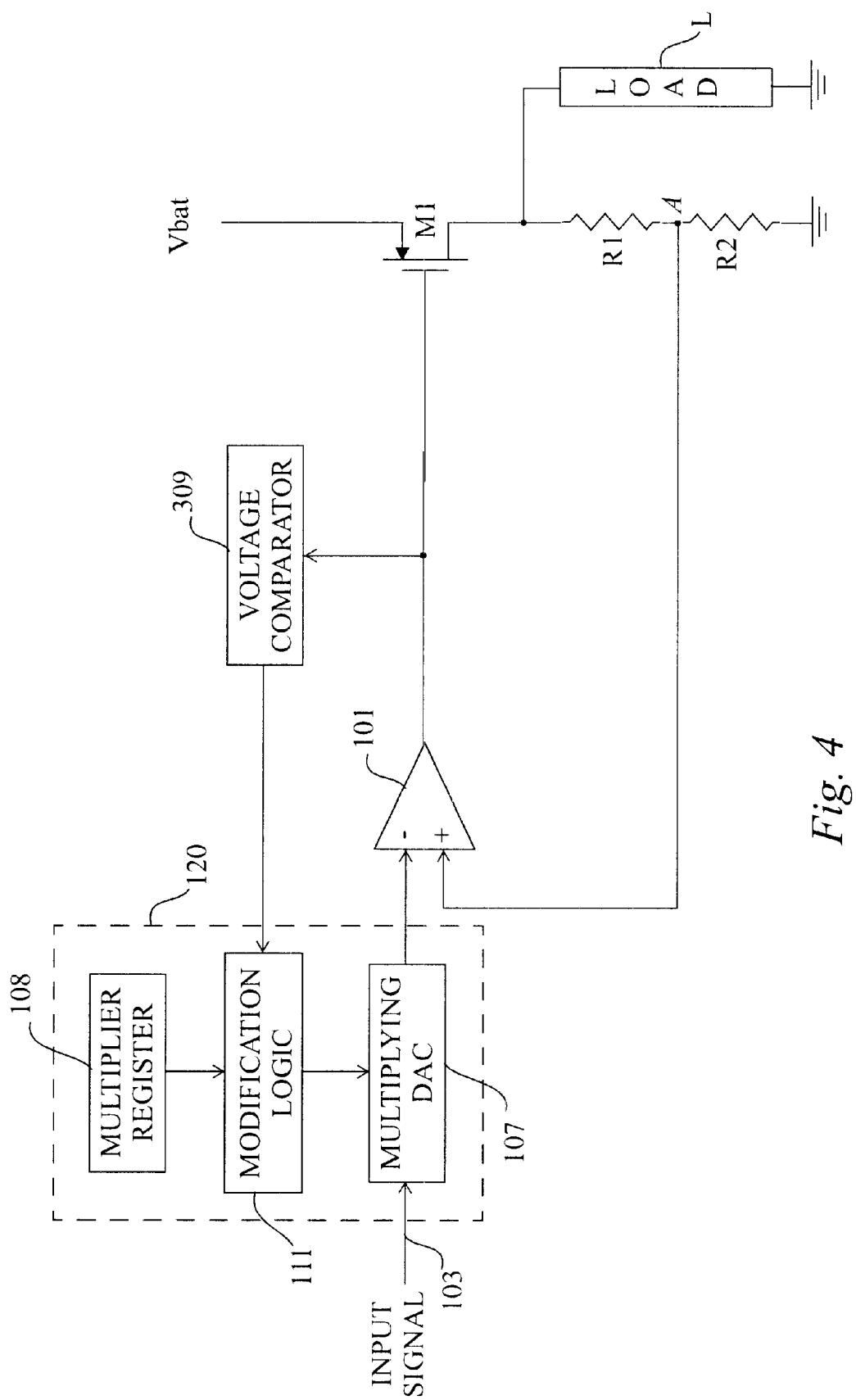
FIG. 4 is a diagram showing a variation of the circuit of FIG. 1.

The principle of the invention is applicable to various different types of active elements, including, for example, field-effect transistors (FETs). An example of such a circuit is shown in FIG. 4, in which the transistor Q1 of FIG. 1 has been replaced by a FET M1. The current monitor 105 and the resistor R3 are omitted from the circuit of FIG. 4. In addition, the threshold comparator of FIG. 1 is replaced by a voltage comparator 309. As the transistor M1 approaches saturation, the gate voltage will rapidly drop (by action of the feedback arrangement) in an unsuccessful attempt to raise the voltage at node A to the desired level. This rapid drop in gate voltage is detected immediately by the voltage comparator 309 to enable corrective action to be taken.

Thus, there has been described saturation prevention techniques and circuits of general utility but having particularly advantageous application to the amplification of communications signals. The onset of saturation is quickly detected and corrective action taken. The circuit is simple in its realization but is highly effective in its operation.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of signal amplification using an amplifier stage having an input terminal, and output terminal and a supply terminal, the method comprising:
    producing an operating supply in accordance with at least one control signal applied to a differencing circuit for feedback control, the operating supply being applied to the supply terminal of the amplifier stage;
    detecting when a relationship between the control signal and the operating supply departs from a desired relationship; and
    as a result of said detecting step, modifying the control signal.

2. The apparatus of claim 1, wherein the amplifier stage forms part of a communications signal amplifier circuit.

3. The apparatus of claim 2, wherein producing an operating supply comprises applying feedback control to a transistor to produce an output signal at a terminal of the transistor, the transistor being coupled to a power source.

4. The apparatus of claim 3, wherein detecting when a relationship between the control signal and the operating supply departs from a desired relationship comprises detecting an electrical quantity at a control terminal of the transistor.

5. The apparatus of claim 4, wherein the transistor is a bipolar transistor, and the electrical quantity is base current.

6. The apparatus of claim 5, wherein detecting when a relationship between the control signal and the operating supply departs from a desired relationship further comprises comparing the base current to a threshold.

7. The apparatus of claim 6, further comprising, when the base current is detected to exceed the threshold, modifying the control signal to prevent saturation of the transistor.

8. The apparatus of claim 4, wherein the transistor is a field-effect transistor, and the electrical quantity is gate voltage.

9. The apparatus of claim 5, wherein detecting when a relationship between the control signal and the operating supply departs from a desired relationship further comprises comparing the gate voltage to a threshold.

10. The apparatus of claim 6, further comprising, when the gate voltage fails beneath the threshold, modifying the control signal to prevent saturation of the transistor.

11. A method of preventing saturation of a transistor, comprising:
    using a control signal applied to a differencing circuit, applying feedback control to the transistor to produce an output signal at a terminal of the transistor;
    detecting an electrical quantity at a control terminal of the transistor; and
    when a threshold condition is found with respect to the electrical quantity, modifying said feedback control by changing a scale factor of the control signal so as to prevent saturation of the transistor.

12. The apparatus of claim 11, wherein the transistor forms part of a communications signal amplifier circuit.

13. The apparatus of claim 11, wherein the transistor is a bipolar transistor.

14. The apparatus of claim 13, wherein the electrical quantity is base current.

15. The apparatus of claim 13, wherein the threshold condition is that the base current exceeds a threshold.

16. The apparatus of claim 4, wherein the transistor is a field-effect transistor, and the electrical quantity is gate voltage.

17. The apparatus of claim 5, wherein detecting when a relationship between the control signal and the operating supply departs from a desired relationship further comprises comparing the gate voltage to a threshold.

18. The apparatus of claim 6, further comprising, when the gate voltage falls beneath the threshold, modifying the control signal to prevent saturation of the transistor.

19. Power supply circuitry for supplying power to a load, the power supply circuitry comprising:
    a transistor coupled to a power source and responsive to a control signal to produce an operating supply at an output terminal of the transistor;
    feedback control circuitry, including a difference circuit responsive to a command signal, for producing said control signal; and saturation prevention circuitry for detecting an electrical quantity at a control terminal of the transistor, and when a threshold condition is found with respect to the electrical quantity, modifying feedback control by changing a scale factor of the command signal so as to prevent saturation of the transistor.

20. The apparatus of claim 19, wherein the load is an amplifier stage for amplifying a communications signal.

21. The apparatus of claim 19, wherein the difference circuit comprises a differencing operational amplifier for producing said control signal, the differencing operation amplifier having as inputs a feedforward signal and a feedback signal, the feedback signal being equal or proportional to a voltage at the output terminal of the transistor.

22. The apparatus of claim 21, wherein the transistor is a bipolar transistor.

23. The apparatus of claim 21, wherein the saturation prevention circuitry comprises a current monitor for producing a measurement signal measuring base current of the transistor, and a threshold comparator for comparing the measurement signal to a threshold.

24. The apparatus of claim 21, wherein the transistor is a field-effect transistor.

25. The apparatus of claim 21, wherein the saturation prevention circuitry comprises a voltage comparator for comparing the gate voltage to a threshold.

26. The apparatus of claim 23, further comprising a data converter responsive to a digital command input signal for producing as a proportionate signal the feedforward signal.

27. The apparatus of claim 26, wherein the data converter is responsive to a stored scale factor in producing the feedforward signal.

28. The apparatus of claim 27, further comprising modification logic responsive to a comparison signal of the threshold comparator for deriving from the stored scale factor a modified scale factor and applying the modified scale factor to the data converter.

* * * * *